United States Patent
Lee et al.

(10) Patent No.: US 11,004,929 B2
(45) Date of Patent: May 11, 2021

(54) TRIMMABLE SILICON-BASED THERMISTOR WITH REDUCED STRESS DEPENDENCE

(71) Applicant: TEXAS INSTRUMENTS INCORPORATED, Dallas, TX (US)

(72) Inventors: Dok Won Lee, Mountain View, CA (US); Erika Lynn Mazotti, San Martin, CA (US); Mark Robert Visokay, Dallas, TX (US); William David French, San Jose, CA (US); Ricky Alan Jackson, Richardson, TX (US); Wai Lee, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/596,972

(22) Filed: Oct. 9, 2019

(65) Prior Publication Data

US 2020/0119132 A1    Apr. 16, 2020

Related U.S. Application Data

(60) Provisional application No. 62/744,521, filed on Oct. 11, 2018.

(51) Int. Cl.
| | |
|---|---|
| *H01L 49/02* | (2006.01) |
| *G01K 7/22* | (2006.01) |
| *H01L 23/522* | (2006.01) |
| *H01L 27/07* | (2006.01) |
| *G01K 7/16* | (2006.01) |

(52) U.S. Cl.
CPC .............. *H01L 28/20* (2013.01); *G01K 7/223* (2013.01); *G01K 7/226* (2013.01); *H01L 23/5228* (2013.01); *H01L 27/0788* (2013.01); *G01K 2007/163* (2013.01)

(58) Field of Classification Search
CPC . H01L 28/20; H01L 23/5228; H01L 27/0788; G01K 7/223; G01K 7/226; G01K 2007/163
See application file for complete search history.

(56) References Cited

U.S. PATENT DOCUMENTS

| | | | |
|---|---|---|---|
| 6,422,088 B1 * | 7/2002 | Oba .......................... | G01D 3/08 73/754 |
| 2004/0164753 A1 * | 8/2004 | Hettori .................. | G01L 9/0054 324/725 |
| 2008/0066562 A1 * | 3/2008 | Sakurai .................... | G01L 5/162 73/862.044 |

* cited by examiner

*Primary Examiner* — Feifei Yeung Lopez
(74) *Attorney, Agent, or Firm* — Andrew R. Ralston; Charles A. Brill; Frank D. Cimino

(57) ABSTRACT

Various examples provide an electronic device that includes first and second resistor segments. Each of the resistor segments has a respective doped resistive region formed in a semiconductor substrate. The resistor segments are connected between first and second terminals. The first resistor segment is configured to conduct a current in a first direction, and the second resistor segment is configured to conduct the current in a second different direction. The directions may be orthogonal crystallographic directions of the semiconductor substrate.

25 Claims, 17 Drawing Sheets

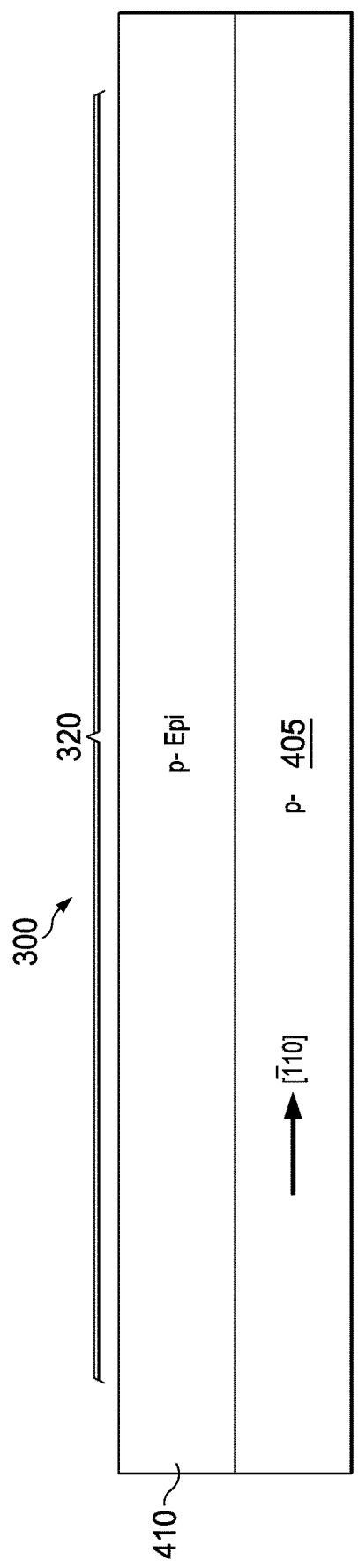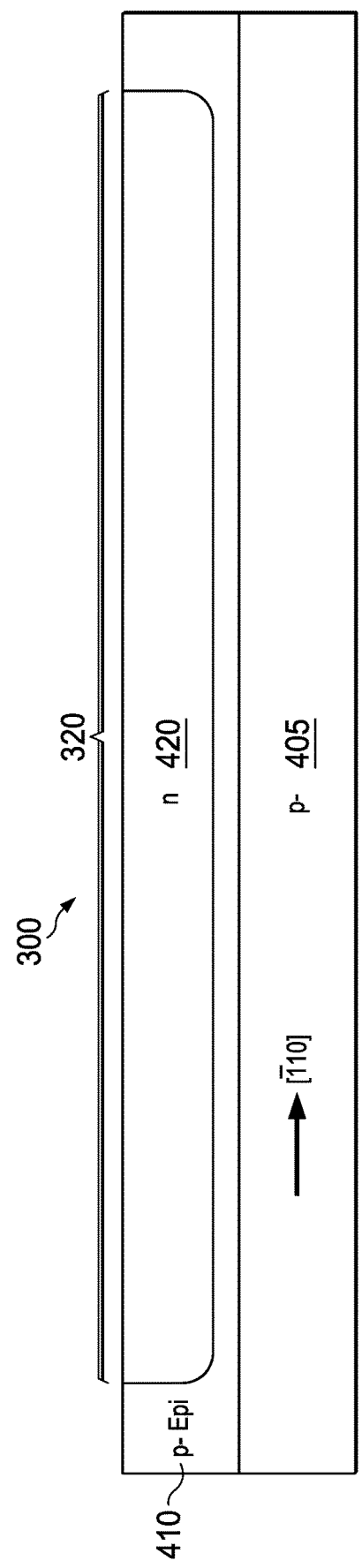
FIG. 4A
FIG. 4B

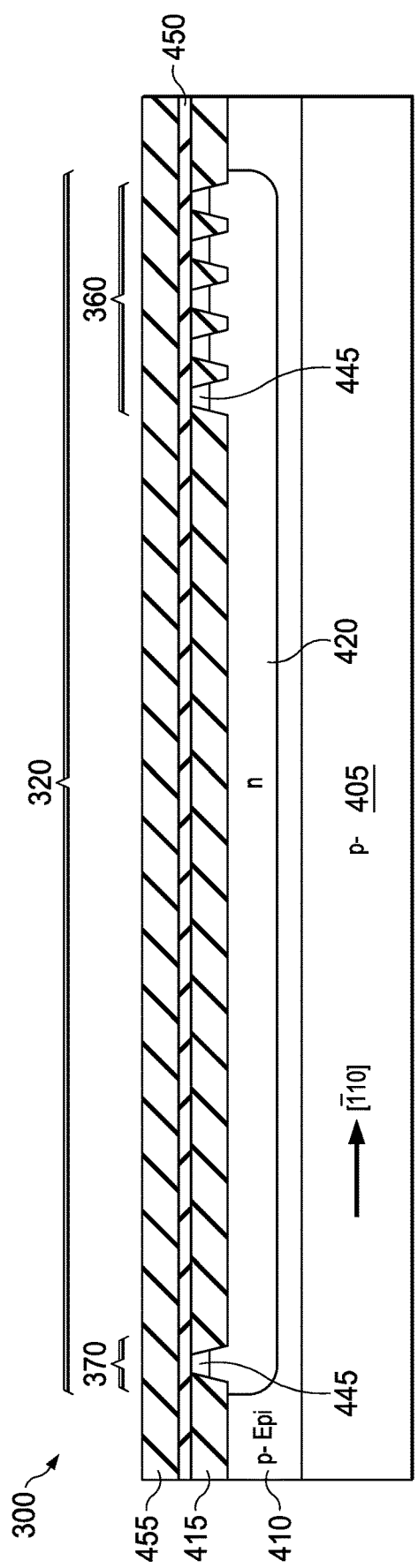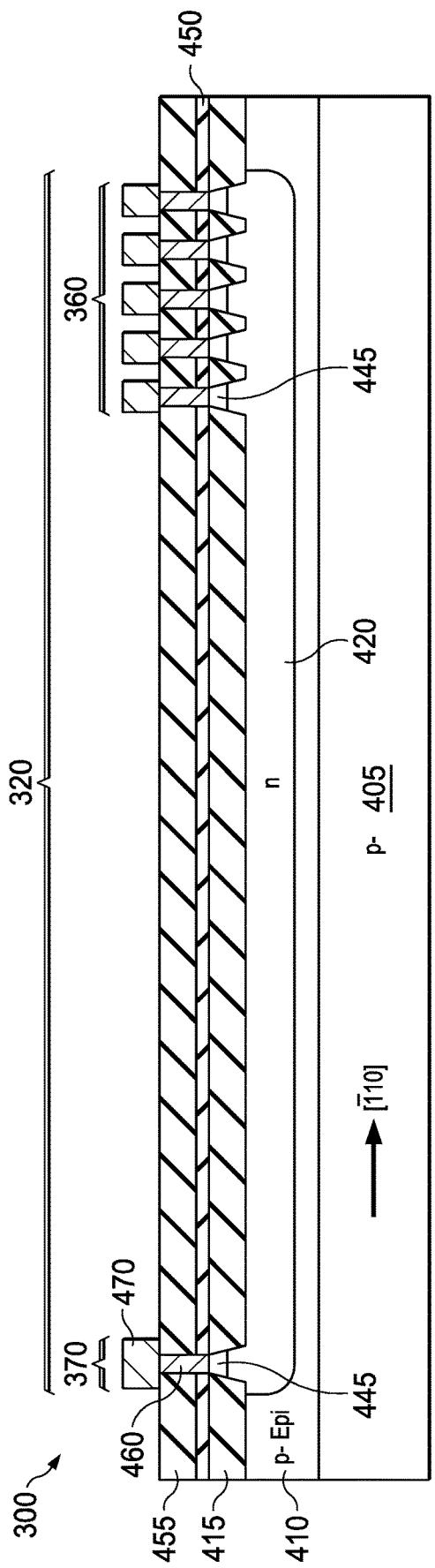

US 11,004,929 B2

TRIMMABLE SILICON-BASED THERMISTOR WITH REDUCED STRESS DEPENDENCE

CROSS REFERENCE TO RELATED APPLICATIONS

This application claims the benefit of U.S. Provisional Patent Application No. 62/744,521 filed Oct. 11, 2018, which is incorporated herein by reference in its entirety. This application is related to U.S. Provisional Patent Application No. 62/744,257, filed on Oct. 11, 2018, and U.S. patent application Ser. No. 16/597,100, each of which is incorporated herein by reference in its entirety.

FIELD

This disclosure relates to the field of semiconductor devices, and more particularly, but not exclusively, to resistive devices, e.g. thermistors.

BACKGROUND

Thermistors are used in a wide variety of applications, including electronics, battery systems, environmental control, petroleum exploration and medical monitoring. If a resistance value of a thermistor differs from a nominal design value due to, e.g. manufacturing variation, a temperature determined from the resistance may not accurately reflect the true temperature of the environment in which the thermistor is located.

SUMMARY

The inventors disclose various methods and devices that may be beneficially applied to manufacturing electronic devices including a resistor, such as thermistor, with reduced stress-dependence of the resistance. While such embodiments may be expected to provide improvements in stability of devices, no particular result is a requirement of the described invention(s) unless explicitly recited in a particular claim.

Various examples provide an electronic device that includes first and second resistor segments. The resistor segments may be thermistors. Each of the resistor segments has a respective doped resistive region formed in a semiconductor substrate. The resistor segments are connected between first and second terminals. The first resistor body is configured to conduct a current in a first direction, and the second resistor body is configured to conduct the current in a second different direction. The directions may be orthogonal crystallographic directions of the semiconductor substrate.

BRIEF DESCRIPTION OF THE VIEWS OF THE DRAWINGS

FIGS. 4A-4F illustrate sectional views of the device of FIG. 3A at progressive stages of formation;

DETAILED DESCRIPTION

The present disclosure is described with reference to the attached figures. The figures may not be drawn to scale and they are provided merely to illustrate the disclosure. Several aspects of the disclosure are described below with reference to example applications for illustration, in which like features correspond to like reference numbers. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events may be required to implement a methodology in accordance with the present disclosure.

Some thermistors use a diffused resistor body that has a positive temperature coefficient. (See, e.g. U.S. patent application Ser. No. 15/639,492, Texas Instruments, referred to hereinafter as "the '492 application", incorporated by reference herein in its entirety.) One version of this diffused resistor body has an n-type doped region that includes a central body and two end regions. The end regions each include spaced contact lines that connect to the resistor body via corresponding heavily doped regions of the body. Selection of the appropriate contact lines to source and sink current to the resistor body may provide the ability to trim the resistance to ±1% of a target value. But the single resistor body may not provide efficient use of device die area, and may also be sensitive to stress imposed by device packaging. Furthermore, the geometric constraints on length and width may limit design flexibility of resistance adjustment increment.

Figure 1:
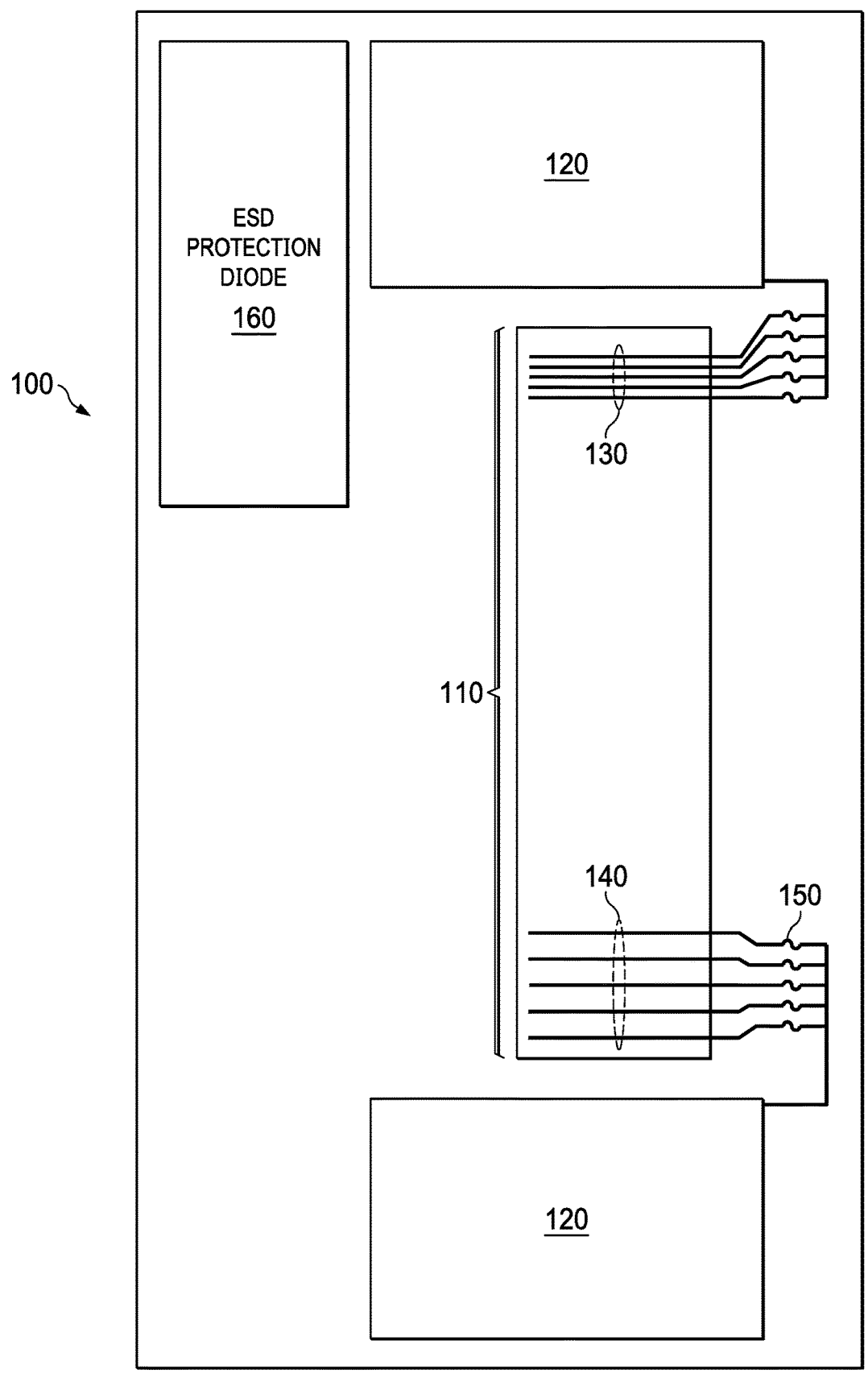
FIG. 1 illustrates an electronic device having a single resistor body with fine and coarse adjust contact lines.

FIG. 1 illustrates a device 100 die that implements a resistor 110 using a single resistor segment configured consistent with design practice described in the '492 application. The resistor 110 is shown with a relative length and width that provide a target resistance. An optional ESD (electrostatic discharge) protection diode 160 is located on the die to protect the resistor 110 from electrostatic discharge events. The resistor 110 includes contact lines 130 at a first end and contact lines 140 at an opposite second end. In the illustrated example the contact lines 130 are relatively closely spaced, and the contact lines 140 are relatively widely spaced. Each connection line is connected to a first or a second connection pad 120 via a corresponding fuse 150. The resistance provided by the device 100 may adjusted, or "trimmed" by selectively severing the connection of a subset of the connection lines to the connection pads 120, for example by opening, or "blowing", a subset of the fuses 150. Thus the device 100 may be considered a potentiometer, as the effective length of the resistor 110 is changed by the trimming process. The trim increment is greater for the widely spaced connection lines, and smaller for the closely spaced connection lines. Thus the more widely spaced connection lines provide a coarse trim, and the more narrowly spaced connection lines provide a fine trim. An objective of the trimming process may include establishing a resistance of the device 100 that is close to a predetermined value, e.g. a design value. It is generally preferred that the resistance of the device 100 remains within a design tolerance of the design value for the operating life of the device 100. However, in some cases the resistance may change under the influence of various factors.

Figure 2A:
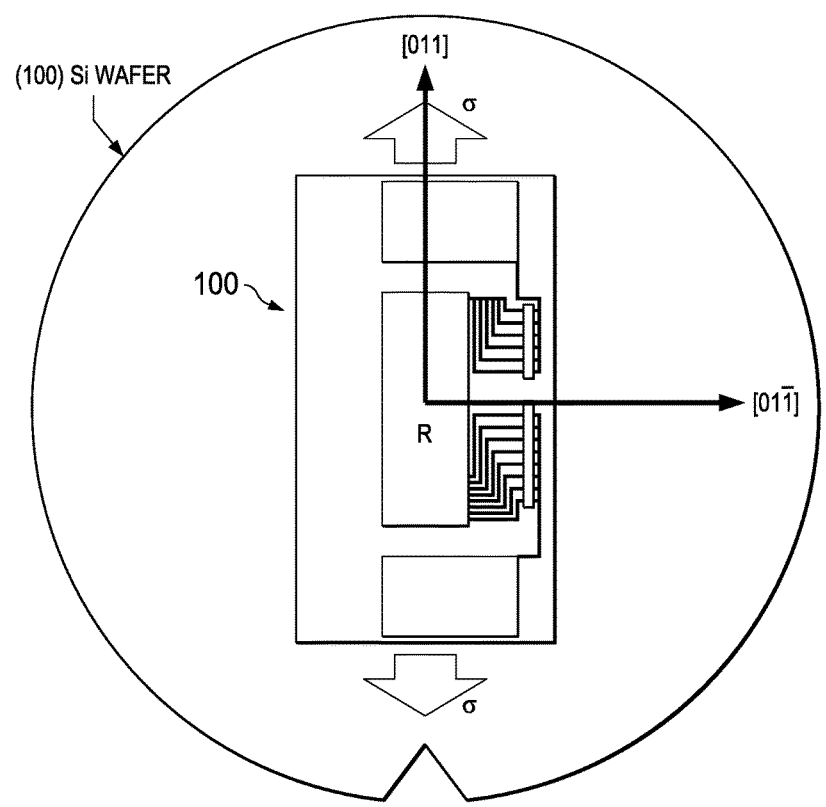
FIG. 2A symbolically illustrates a baseline relationship between the device of FIG. 1 and a (100) substrate, with stress applied in the vertical directions.

FIG. 2A illustrates a representation of the device 100 on a silicon wafer having a (100) crystal plane at the wafer surface and a <110> notch. Such a substrate may be referred to as a (100) substrate. As determined from well-known crystal stereographic projections, a horizontal axis of the wafer surface is oriented in the [011] lattice direction, and a vertical axis of the wafer surface is oriented in the [01$\bar{1}$] lattice direction. In this example a first (long) axis of the resistor 110 is oriented parallel to the vertical axis, and a second (short) axis of the resistor 110 is oriented parallel to the horizontal axis.

When a stress σ is applied in the vertical axis, the resistance of the resistor 110 may change due to a piezo-resistive effect particular to the [01$\bar{1}$] direction. Table I displays example modelled changes of resistance of a representative resistor R when a positive (tensile) and negative (compressive) 100 MPa stress σ is applied in the vertical direction. The resistance change is seen to be equal and opposite for the equal and opposite applied stresses. Note that the effect of the resistance change is only manifested for a current in the direction of the resistance change, in the [01$\bar{1}$] direction in the current example.

TABLE I

Baseline Resistor on a (100) Substrate

| σ | $\Delta R_{total}/R_{total}$ |
|---|---|
| +100 MPa | −3.12% |
| −100 MPa | +3.12% |

This piezo-resistive effect may be manifested in a production instance of the resistor R when the device 100 die is packaged. In the packaged system, the die is typically attached to a lead frame by an adhesive, and this assembly is then encapsulated in plastic resin. The packaged device 100 is then typically mounted on a circuit assembly, e.g. a printed circuit board (PCB). The lead frame attachment and/or the encapsulant may impose a stress on the resistor 110 in the vertical direction. In some production examples of the device 100, an average resistance change of about 3% has been observed after packaging. Moreover, the stress on different instances of the device 100 in a population of the device 100 may not be equal, resulting in an increase of the deviation of resistances in the population from an average. Mounting of the packaged device 100 to the circuit assembly may produce additional, generally unpredictable stress that may change with temperature. The combination of these effects generally renders impractical a strategy to pre-compensate the trimming of the device 100 to account for packaging and mounting effects. As a result, a design tolerance that accounts for various sources of stress of the device 100, as well as the as-assembled scatter of resistances, may be larger than would be preferred.

Figure 7A:
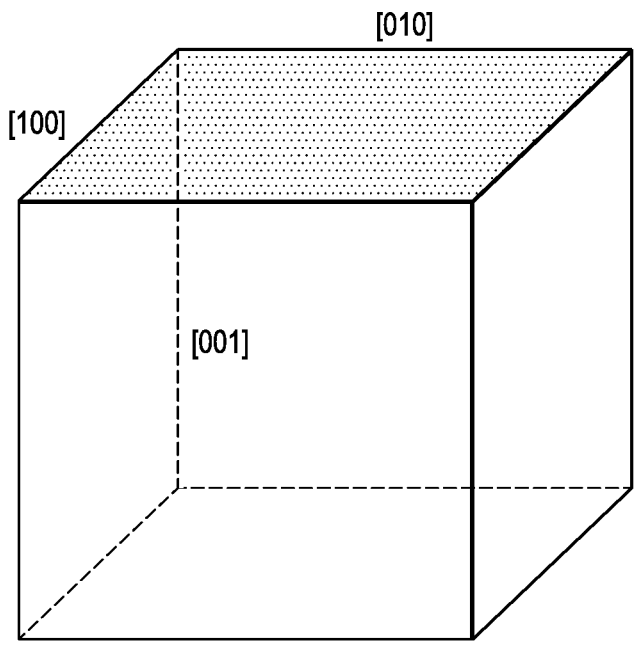
FIGS. 7A and 7B illustrate aspects of the crystallography of a (100) silicon substrate.
Figure 7B:
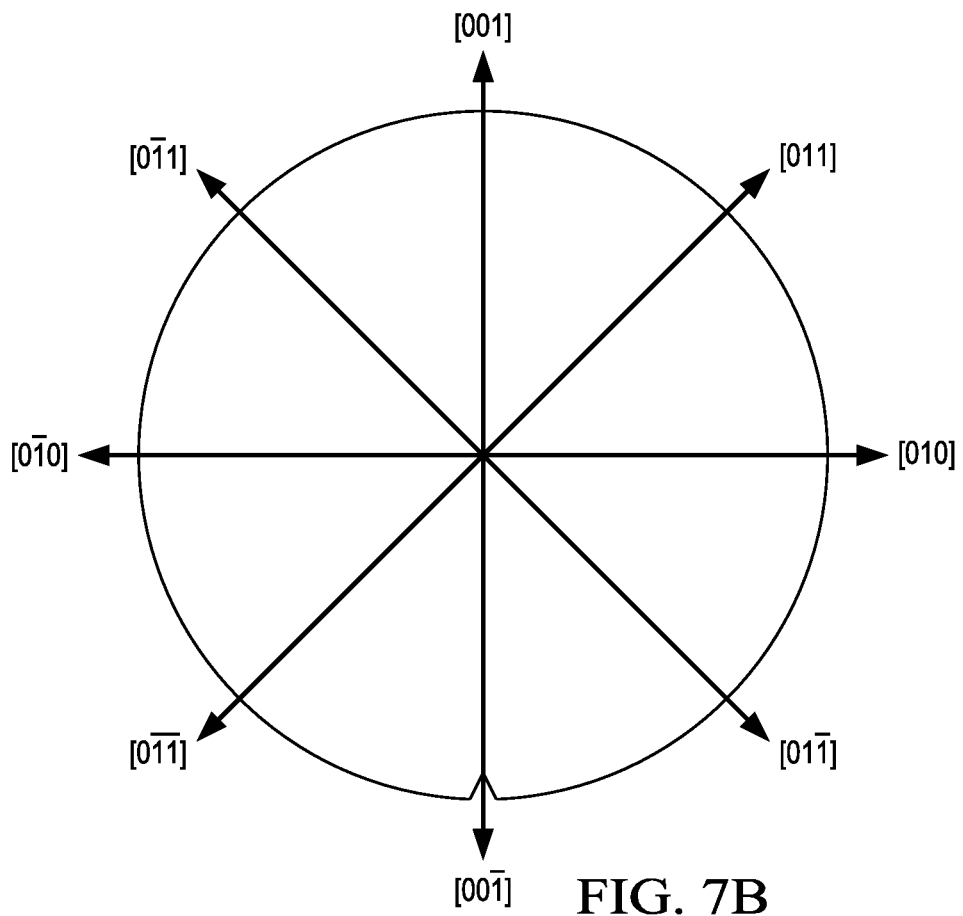

Referring to FIG. 7A, a cube representing the silicon lattice unit cell is shown, with the highlighted (100) plane at a top side of the unit cell. In FIG. 7B, a (100)-silicon wafer with a [001] notch is shown with various crystallographic directions shown. There are four variants of [100] and four variants of [011]. As used herein, "variants" of a crystallographic direction are all crystallographically equivalent. A bar over a particular digit represents a mathematical sign of the crystallographic direction in the lattice. The members of a set of equivalent crystallographic directions may be referred to as a "family", which may be denoted by < . . . > brackets. Thus, any of the directions [001], [00$\bar{1}$], [010] and [0$\bar{1}$0] may be referred to by the family indices <001> with no loss of generality. Similarly all variants of the [011] crystallographic direction are equivalent and may be referred to by family indices <011> with no loss of generality. Overbars indicating a specific crystallographic direction may be used where such specificity aids the discussion.

The inventors have determined that the stability of a resistor formed in a semiconductor substrate, e.g. silicon, may be improved by splitting the resistor into two components each configured to conduct current in different directions. In the particular case of a silicon (100) wafer with a <001> notch, a first resistive component that may be referred to as $R_1$ is configured to conduct current in a first direction, e.g. parallel to the lattice direction, and a second resistive component that may be referred to as $R_2$ is configured to conduct current in a second direction, e.g. parallel to the [001] lattice direction.

Figure 2B:
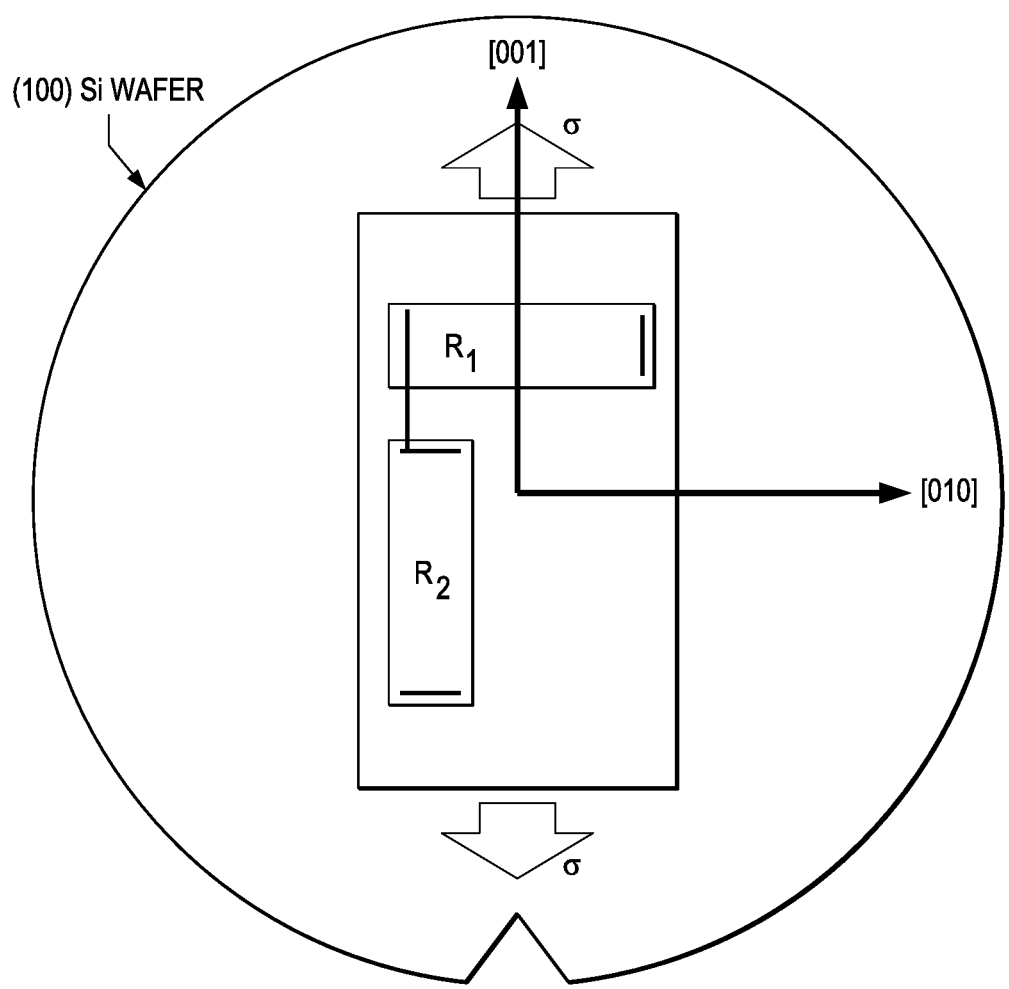
FIG. 2B symbolically illustrates the relationship between two resistors and a (100) silicon wafer, with stress applied in the vertical directions.

FIG. 2B illustrates a representation of such a split-resistance device overlaid on a (100) silicon wafer for visualization. The resistors $R_1$ and $R_2$ are connected to provide a total resistance $R_1+R_2$ between two connection terminals, or pads (not shown). Table II presents calculated values of resistance change of a nominal resistor $R_1$ oriented to conduct parallel to the [010] direction and a nominal resistor $R_2$ oriented to conduct parallel to the [001] direction. The change of vertical (e.g. [001]) resistance due to a has an opposite sign of the change of horizontal (e.g. [010]) resistance due to G. Moreover, the change of resistance in the direction of the applied stress has a magnitude about twice that of the change of resistance in the direction transverse to the applied stress. Thus for example, the resistance of $R_2$ changes about −10% for σ=100 MPa, while the resistance of $R_1$ changes about +5% under the same stress. The change ΔR of the total resistance $R_{total}=R_1+R_2$ decreases about 2.5% when $R_1=R_2$.

TABLE II

Split Resistance Orientation on a (100) Substrate

| σ | $\Delta R_1/R_1$ | $\Delta R_2/R_2$ | $\Delta R_{total}/R_{total}$ |
|---|---|---|---|
| +100 MPa | 5.34% | −10.22% | −2.44% |
| −100 MPa | −5.34% | +10.22% | +2.44% |

The change of $R_{total}$ may be reduced by decreasing the value of the resistor providing the larger contribution to $\Delta R_1$, $R_2$ in the present example. If the resistance of $R_2$ is scaled by the ratio of $\Delta R_1/R_1$ divided by $\Delta R_2/R_2$, the net resistance change ΔR may be reduced to about zero. In the current example, a resistance of $R_1$ about two times $R_2$ may achieve this result, more specifically about 1.9 times. The relative values may be implemented by providing different dimensions of $R_1$ and $R_2$. Assuming rectangular geometry, $R_2$ may be made shorter than $R_1$ (in the direction of current flow) or wider (transverse to the direction of current flow) to achieve the desired relative resistances.

Figure 7C:
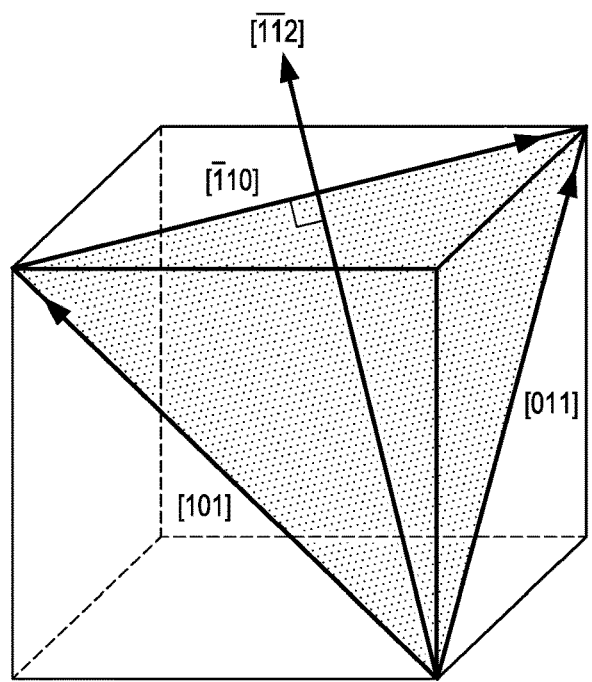
FIGS. 7C and 7D illustrate aspects of the crystallography of a (111) silicon substrate.
Figure 7D:
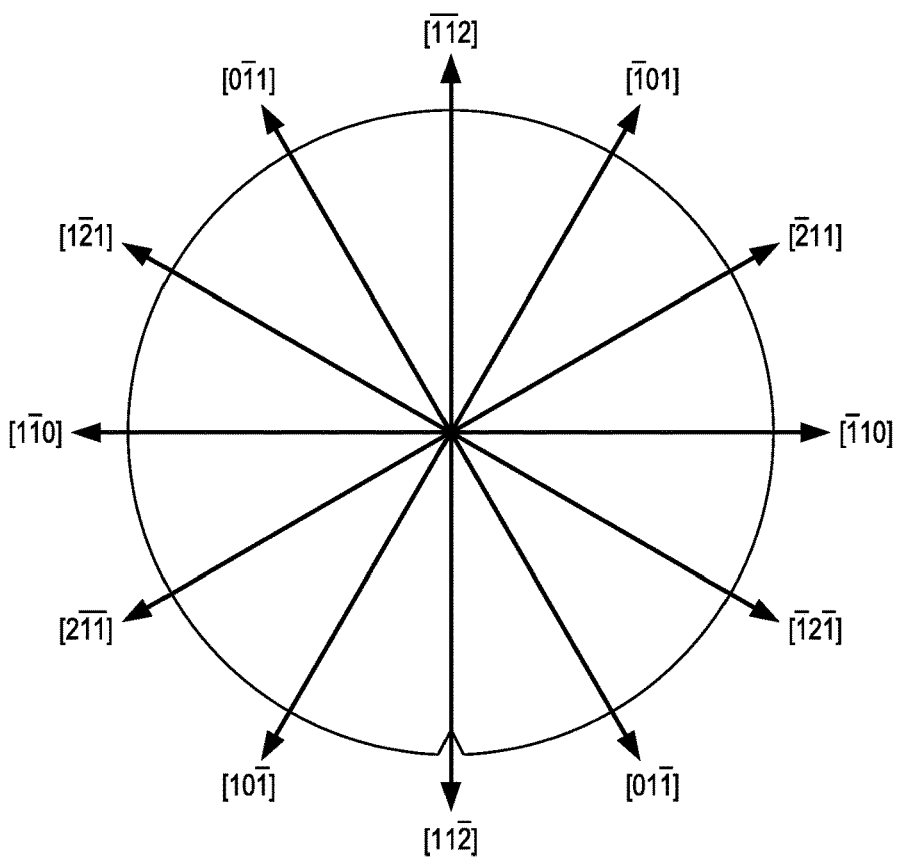

Production silicon wafers are also available with a (111) lattice plane at the wafer surface. Such a substrate may be referred to as a (111) substrate. The (111) plane includes the <110> and <112> crystallographic directions, some of which are orthogonal to each other. Referring to FIG. 7C, a cube representing the silicon lattice unit cell is shown, with the highlighted (111) plane intersecting three corners of the cube. A ray in the [$\bar{1}$10] direction intersects a ray in the [$\bar{1}\bar{1}$2] direction at a right angle. In FIG. 7D, a (111)-silicon wafer is shown with various crystallographic directions shown. There are six variants of [112] and six variants of [110]. All variants of [112] are equivalent and may be referred to as a <112> direction with no loss of generality. Similarly all variants of the [110] crystallographic direction are equivalent and may be referred to as a <110> direction with no loss of generality.

Figure 2C:
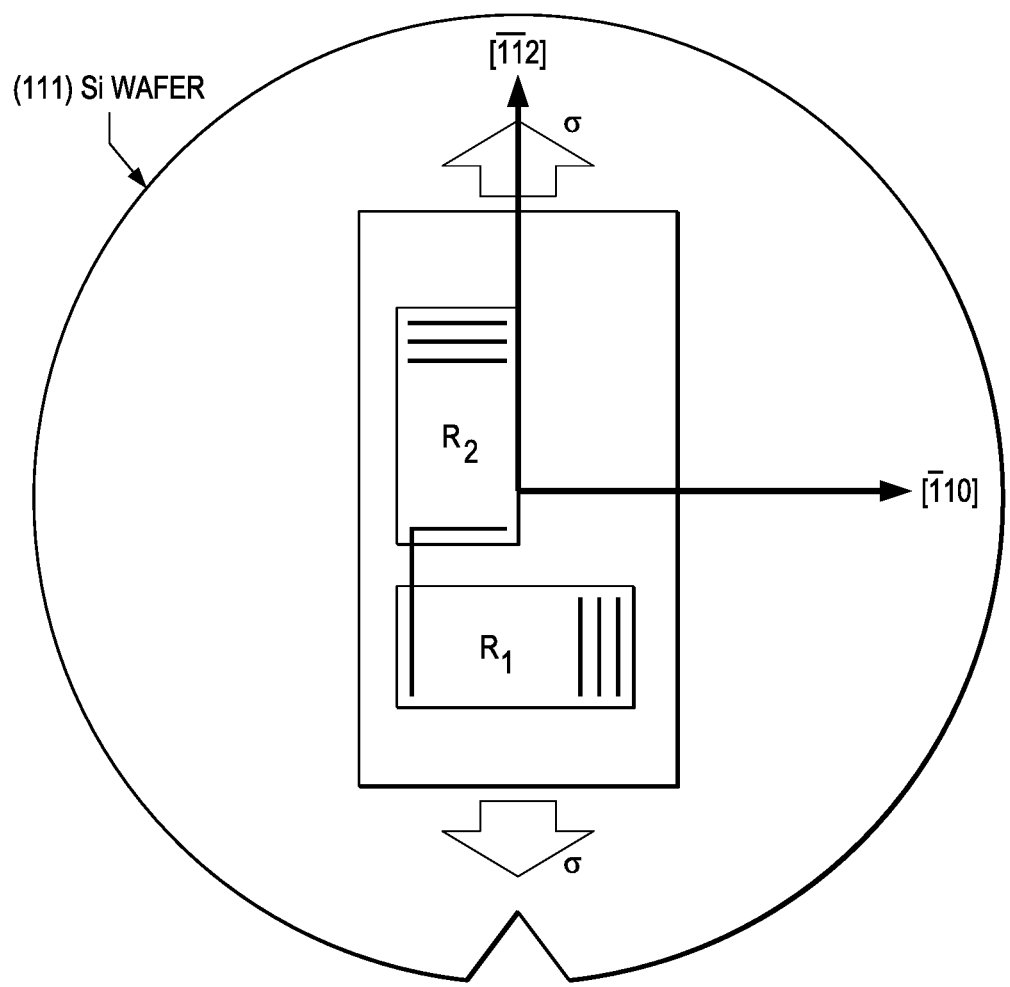
FIG. 2C symbolically illustrates the relationship between two resistors and a (111) silicon wafer, with stress applied in the vertical directions.

FIG. 2C illustrates a representation of a split-resistance device overlaid on a (111) silicon wafer for visualization. Resistors $R_1$ and $R_2$ are oriented such that current flows through $R_1$ parallel to the [$\bar{1}$10] direction and flows through $R_2$ parallel to the [$\bar{1}\bar{1}$2] direction. Table III presents the modeled change of resistance of $R_1$ and $R_2$ for representative structures formed on a (111) silicon wafer. For the case that a 100 MPa tensile stress σ is applied in the [$\bar{1}\bar{1}$2] direction the resistance of $R_1$ increases by about 3%, while the resistance of $R_2$ decreases by about the same amount. For the case that a 100 MPa compressive stress is applied in the [$\bar{1}\bar{1}$2] direction the effect is about equal and opposite. A total resistance change of the $R_{total}$ is shown again assuming $R_1=R_2$, and is close to zero for both tensile and compressive stresses. Thus it can be expected that a resistor design that includes a combination of resistive segments, some oriented to conduct in the [$\bar{1}$10] direction (<110> family) and some oriented to conduct in the [$\bar{1}$12] direction (<112> family), will have a more stable total resistance value in the presence of various sources of mechanical stress as describe previously.

TABLE III

Split Resistance Orientation on a (111) Substrate

| σ | $\Delta R_1/R_1$ | $\Delta R_2/R_2$ | $\Delta R_{total}/R_{total}$ |
|---|---|---|---|
| +100 MPa | +2.97% | −3.12% | −0.07% |
| −100 MPa | −2.97% | +3.12% | +0.07% |

Figure 3A:
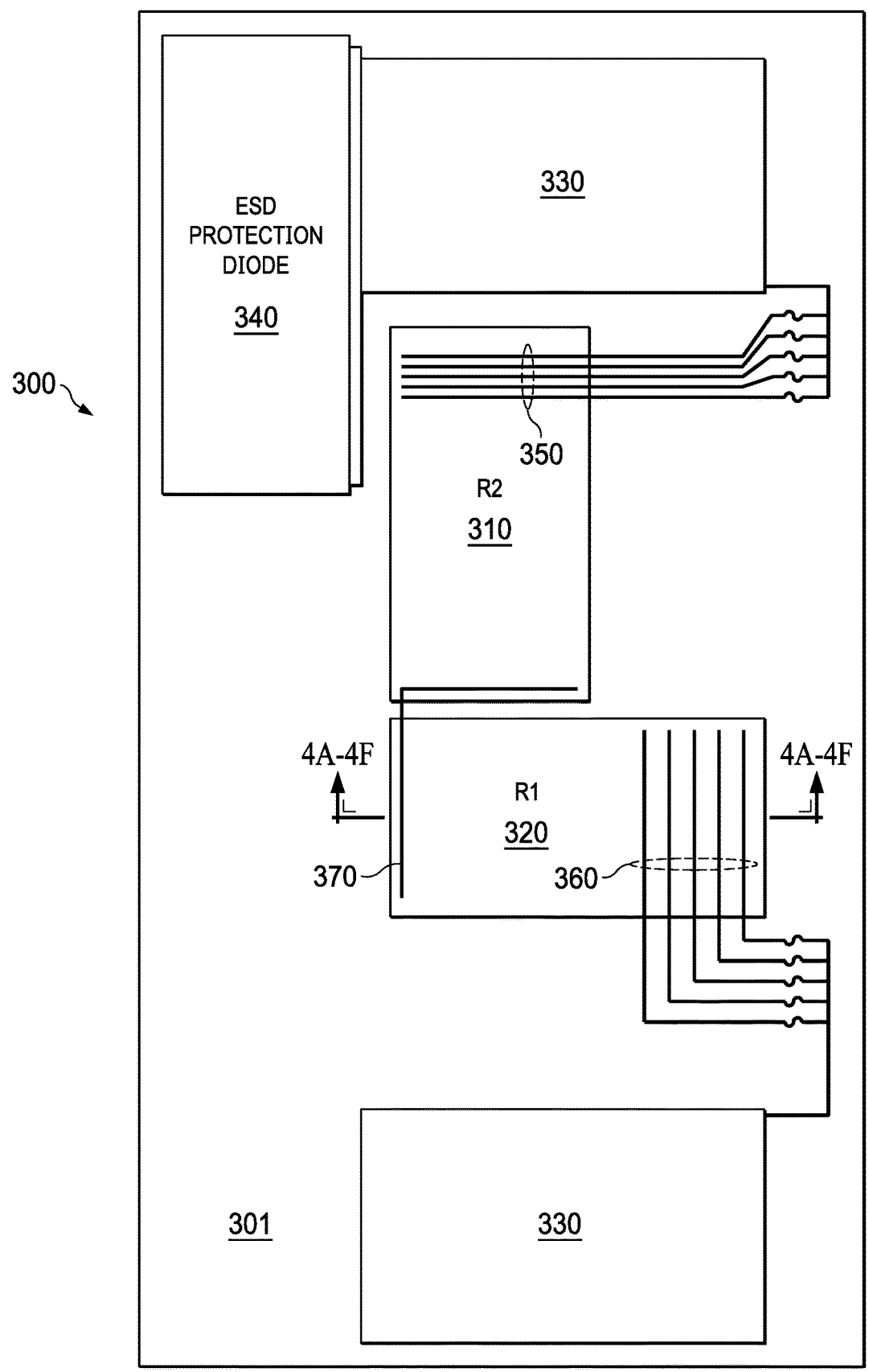
FIGS. 3A and 3B illustrate examples of electronic devices including a first resistor segment configured to conduct in a first, e.g. horizontal, direction and a second resistor segment configured to conduct in a second, e.g. vertical, direction.

FIG. 3A illustrates an embodiment of an integrated circuit (IC) 300 including a multi-segment resistor formed on a substrate 301 according to principles of the disclosure. While the substrate 301 may be a silicon substrate, the described principles may be applied to other material systems, e.g. germanium (Ge), silicon germanium (SiGe) and gallium arsenide (GaAs). The IC 300 is described without implied limitation using the example of FIG. 2C (using a (111) substrate). The IC 300 includes two resistor segments 310, 320 connected between pads 330. The pads 330 may be configured to be used as wire-bonding terminals, such as by having a minimum side length of about 80 μm. The segments 310, 320 are connected in series between the pads 330, but configurations are not limited to series connectivity. In general the resistor segments 310 and 320 form a resistor network connected between the pads 330.

The first resistor segment 320 (R1) is interconnected such that a current path through the segment 320 is in the [$\bar{1}$10] direction, or equivalent. The second resistor segment 310 (R2) is interconnected such that a current path through the segment 310 is in the [$\bar{1}\bar{1}$2] direction or equivalent. Note that these lattice directions are merely examples. For the (111) substrate the current paths through R1 and R2 need not be aligned to these lattice directions as long as the current paths are about 90° apart (orthogonal). Each segment 310, 320 has a head region at which a number of contact lines are connected. In the current example, the combined resistor segments 310, 320 are configured as a potentiometer, having contact lines 350 connected to the segment 310 at its head region, and contact lines 360 connected to the segment 320 at its head region. The segments 310, 320 are connected to each other by an interconnection line 370 that connects at each end to the respective segments 310, 320 by a contact line. As illustrated, each resistor segment conducts in a single direction, e.g. only horizontally or only vertically. Such implementations may be advantageous over alternate configurations, e.g. serpentine resistor segments, by providing a uniform and predictable resistance in the horizontal and vertical directions. Such uniformity may provide simpler design models to configure various implementations of the device 300.

Unreferenced fuses between each of the contact lines 350, 360 and a corresponding one of the pads 330 may be used to trim the total resistance between the pads 330. In the illustrated example, the contact lines 360 have a wider spacing than the contact lines 350. The contact lines 360 may thus be used as a coarse adjustment of the total resistance by blowing one or more of the fuses connected to the contact lines 360. Similarly the contact lines 350 may be used as a fine adjustment of the total resistance by blowing one or more of the fuses connected to the contact lines 350. The pads 330, contact lines 350, 360, interconnection line 370 and fuses may be implemented using a copper or aluminum interconnect process. An optional ESD protection diode 340 may be located on the substrate 301 to protect the segments 310, 320 and interconnects from damage during an ESD event.

Because the resistor segments 320 and 310 are respectively oriented to conduct current in the [$\bar{1}$10] direction and the [$\bar{1}\bar{1}$2] direction, it is expected that the IC 300 will exhibit less sensitivity to packaging and mounting stress than a resistor implemented on a (100) substrate, as described above. This reduced stress sensitivity is expected to result in benefits including greater packaged device yield, fewer field failures, and tighter tolerance of nominal resistance value.

The segments 310, 320 have about a same length along a longer axis and a about a same width along a shorter axis, and thus have a same nominal resistance in the direction of current flow along the longer axis. In examples implemented on a (100) substrate, the $R_2$ segment may be shorter and/or wider than the $R_1$ segment, such that the resistance of the $R_2$ segment in the direction of (vertical) current flow is less than that of the $R_1$ segment in the direction of (horizontal) current flow. If both the $R_1$ and $R_2$ segments have about a same width (transverse to current flow), the $R_1$ segment may have a length about twice that of the $R_2$ segment, more specifically about 1.9 times.

Figure 3B:
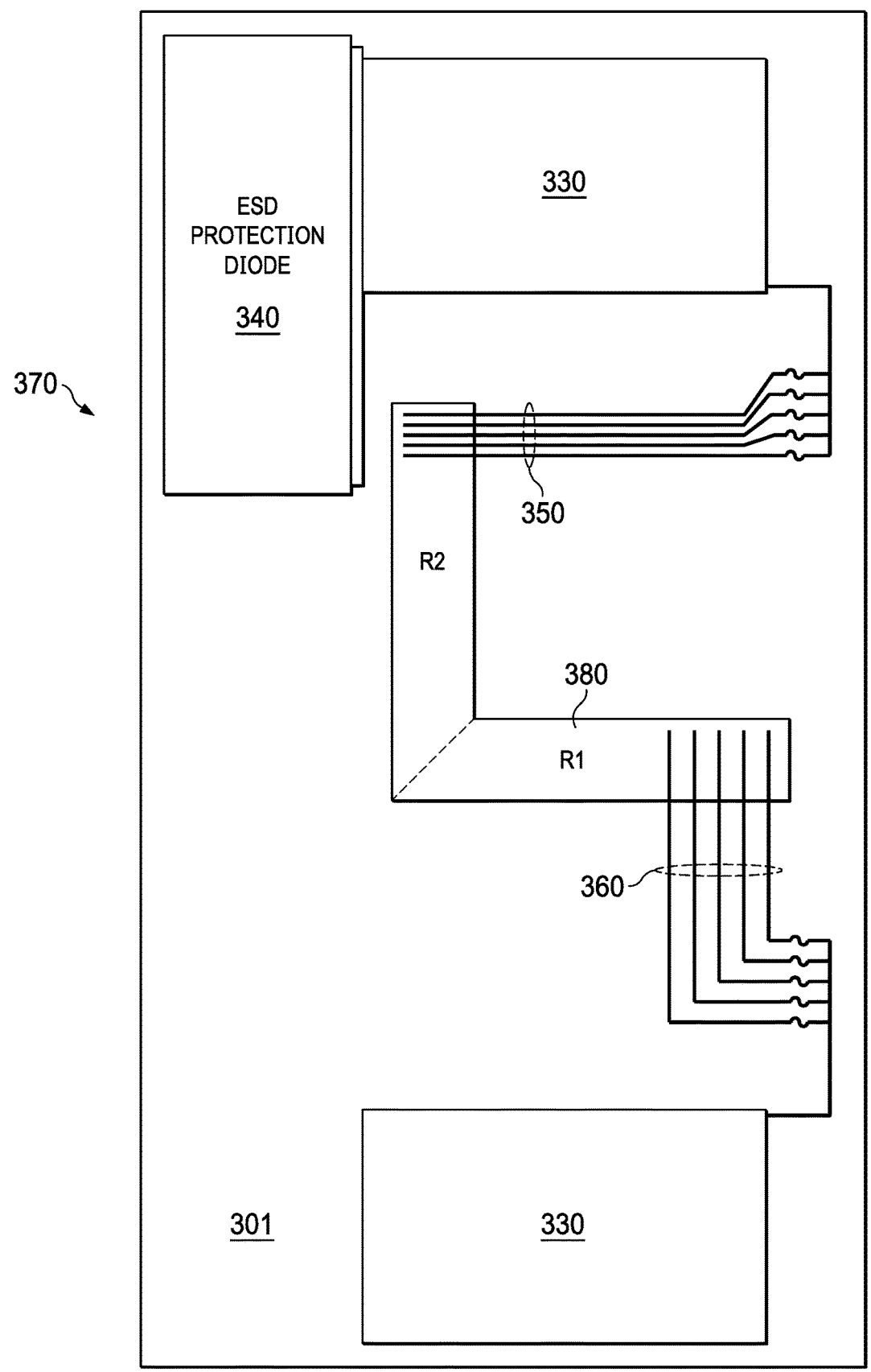

FIG. 3B illustrates an alternate example of an IC 370 that includes a multi-segment resistor formed on the substrate 301. In this example, a single implanted resistive region 380 includes a first segment $R_1$ and a second segment $R_2$. The segment R₁ is configured to conduct current generally horizontally (e.g. parallel to the [010] direction of a (100) silicon wafer or parallel to the [$\bar{1}$10] direction of a (111) silicon wafer), and the segment R₂ is configured to conduct current generally vertically (e.g. parallel to the direction of a (100) silicon wafer or parallel to the [$\bar{1}\bar{1}$2] direction of a (111) silicon wafer). Differently than the IC 300, current in the R₁ and R₂ segments of the IC 370 flows directly between the R₁ and R₂ segments without an interconnection line. While this arrangement may result in some perturbation of the current flow between the R₁ and R₂ segments at the corner of the resistive region 380, proper selection of the length and width of the R₁ and R₂ segments is expected to provide the benefits described above of reduced sensitivity of the IC 370 to stress imposed by packaging and/or board mounting.

Figure 8:
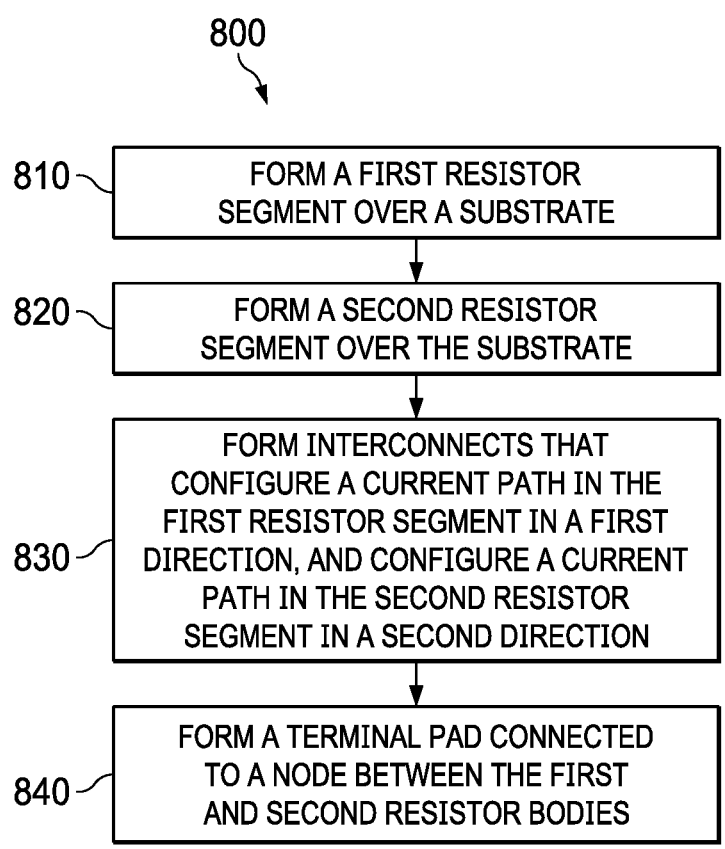
FIG. 8 presents a method of forming an electronic device such as the segmented resistor of FIG. 3.

Turning to FIG. 8, an example method 800 is shown for forming an electronic device, e.g. an integrated circuit, according to the principles of the disclosure. The method 800 is described with further reference to FIGS. 4A-4F, which show in one example progressive stages of manufacturing the IC 300 as viewed in a sectional view cut through the resistor segment 320, as indicated by the cutline shown in FIG. 3A.

Figure 4C:
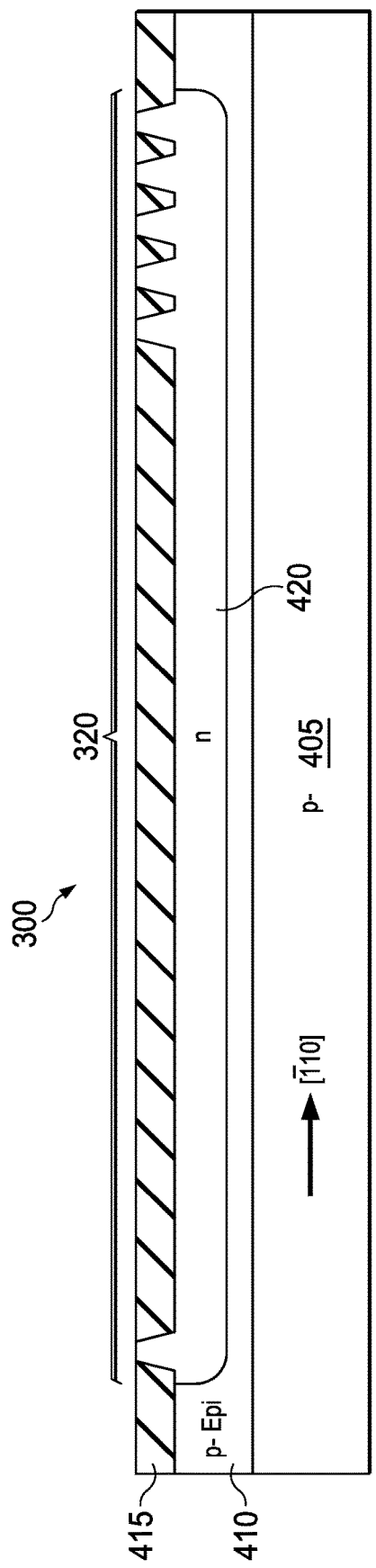

In a step 810 a first resistor segment is formed in a semiconductor substrate. The substrate may be a (111) substrate or a (100) substrate as previously described. The resistor segment may optionally be rectangular. Referring to FIG. 4A, a sectional view of the resistor segment 320 is shown at an early stage of formation. A lightly-doped p-type epitaxial layer 410 has been formed over a lightly doped p-type (111) substrate 405. A lateral direction is shown as [$\bar{1}$10] for reference without implied limitation. If the substrate 405 is a (100) substrate then the lateral direction may be [010]. Optionally the resistor segment may have a long axis oriented in the lateral direction. In FIG. 4B, an n-type well 420 has been formed within the epitaxial layer 410. The n-type well 420 may be formed by conventional process steps including photolithography, n-type dopant implant, and anneal. The n-type well 420 is an example of a doped resistive region that may be a portion of a resistor segment. In one example, the n-type well may be doped with phosphorous with a dopant concentration of about $5 \times 10^{15}$ cm$^{-3}$ with a junction depth of about 2.5 μm. In FIG. 4C, isolation regions 415 have been formed, e.g. by an STI or LOCOS process.

Referring back to FIG. 8, in a step 820 a second resistor segment is formed in the substrate. The second resistor segment may be formed as described for the first resistor segment, and may be formed concurrently with the first resistor segment. Thus the second resistor segment may have a long axis oriented orthogonally to the lateral direction indicated in FIG. 4C, for example [$\bar{1}\bar{1}$2] corresponding to the illustrated lateral [$\bar{1}$10] direction, or [001] corresponding to the alternate example of [010] lateral direction.

In a step 830 a first plurality of interconnection lines is formed that configure the first resistor segment to conduct current in a first direction, and configure the second resistor segment to conduct current in a second different direction. For example, referring to FIG. 3A, contact lines 360 may be formed over the first resistor segment 320, and contact lines 360 may be formed over the second resistor segment 310. The interconnection line 370 may connect the first resistor segment to the second resistor segment. The pads 330 may be formed to provide terminals to a current source and sink.

Figure 4D:
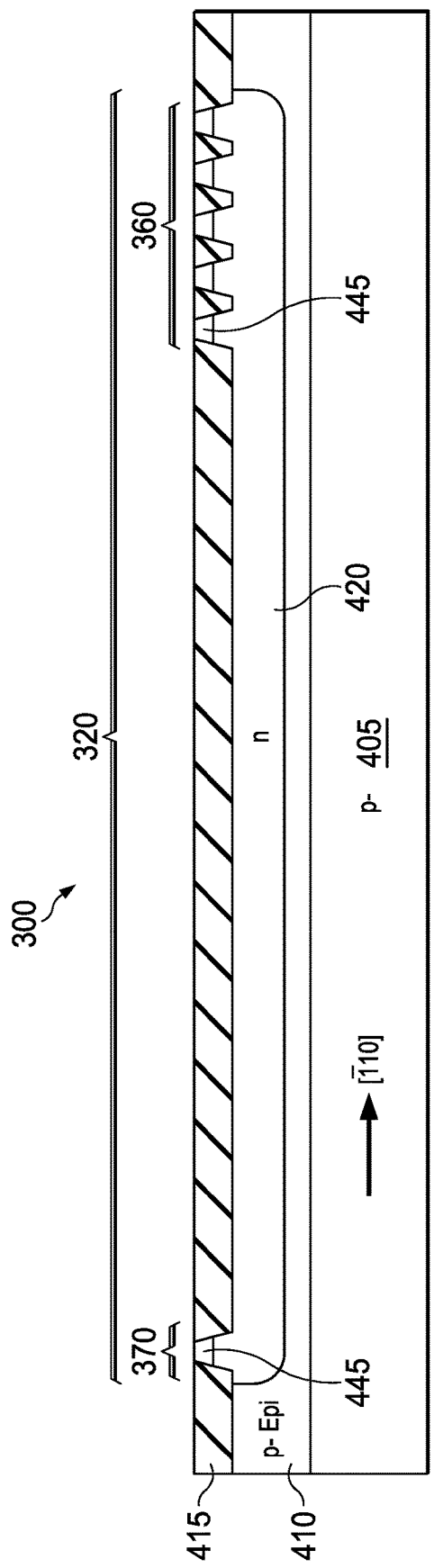

Referring to FIG. 4D, n+ contact strips 445 have been formed, e.g. by an n-type dopant implant into the exposed portions of the n-type well 420. In a step not explicitly shown, the n+ contact strips may be silicided by a conventional process step. The silicided contact strips 445 extend along the well 420 to provide a low-resistance connection between the well 420 and the overlying interconnect metal formed in a later step. In FIG. 4E dielectric layers 450 and 455 have been formed over the substrate 405. The dielectric layer 450 may be present to maintain compatibility of the process sequence with a process flow used to form transistor gate dielectrics in other devices, and may optionally be omitted. The dielectric layers 450 and 455 may be silicon oxide or other suitable dielectric material. In FIG. 4F, metal interconnects, e.g. vias 460 and lines 470, have been formed. As shown, the metal interconnects may be formed by conventional tungsten plug and aluminum line processes. In other examples a copper damascene process may be used.

Referring back to FIG. 8, in an optional step 840 a probe pad is formed that connects to a node between the first and second resistor segments. The probe pad may be formed in the same metal layer as the interconnects, and may be smaller than the pads 330, for example having a minimum side length of about 50 m. As discussed further below, the probe pad may be used to separately determine a resistance of one or more resistor segments configured to conduct in the horizontal direction, and a resistance of one or more resistor segments configured to conduct in the vertical direction.

Figure 5A:
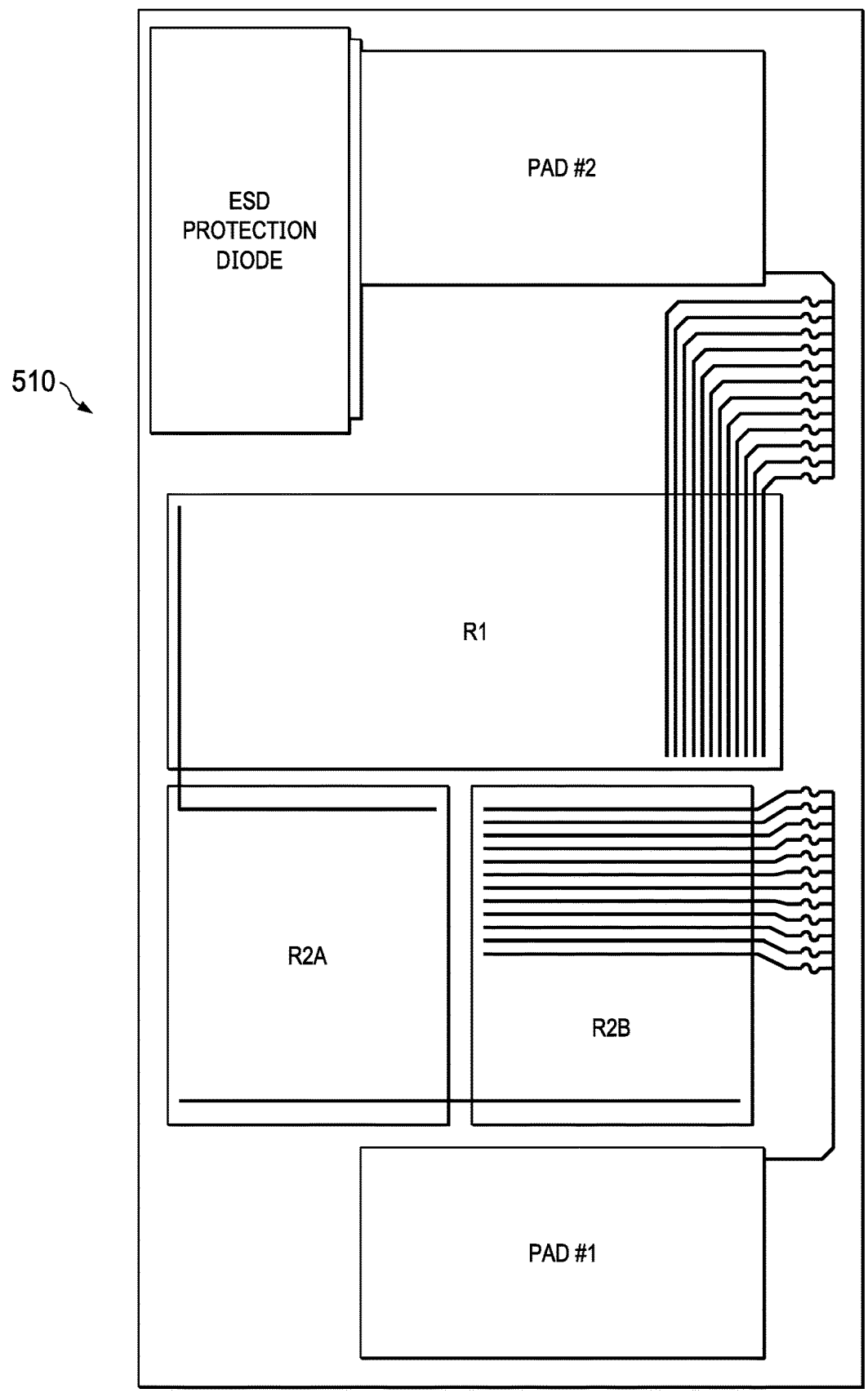
FIGS. 5A and 5B illustrate two examples of electronic devices that are configured to reduce sensitivity to stress applied to the device substrates.

FIG. 5A illustrates another example of an integrated circuit 510 in which resistor segments R1, R2A and R2B are configured to implement a potentiometer that may also operate as a thermistor. The integrated circuit 510 is described using the (111) substrate as an example, may be readily implemented on a (100) substrate with suitable adjustments of resistor geometry. The resistor segment R1 is configured to conduct current in the horizontal direction (e.g. [$\bar{1}$10] direction) and the resistor segments R2A and R2B are configured to conduct current in the vertical direction (e.g. [$\bar{1}\bar{1}$2] direction). The resistor segments R2A and R2B may have about a same resistance in the direction of vertical current flow, and each of R2A and R2B may have a resistance about one-half the resistance of R1 in the direction of horizontal current flow. The resistor segments are interconnected such that the resistance between the terminal pad 1 and terminal pad 2 is the series combination of R1, R2A and R2B. In the illustrated example, terminal pad 1 is connected to R2B by way of a first plurality of contact lines, R2B is connected to R2A by way of a first interconnect line, R2A is connected to R1 by a second interconnect line, and R1 is connected to terminal pad 2 by way of a second plurality of contact lines. The configuration of the integrated circuit 510 may provide some benefit over that of the integrated circuit 300 by more efficient use of space, allowing for a smaller die area.

Figure 5B:
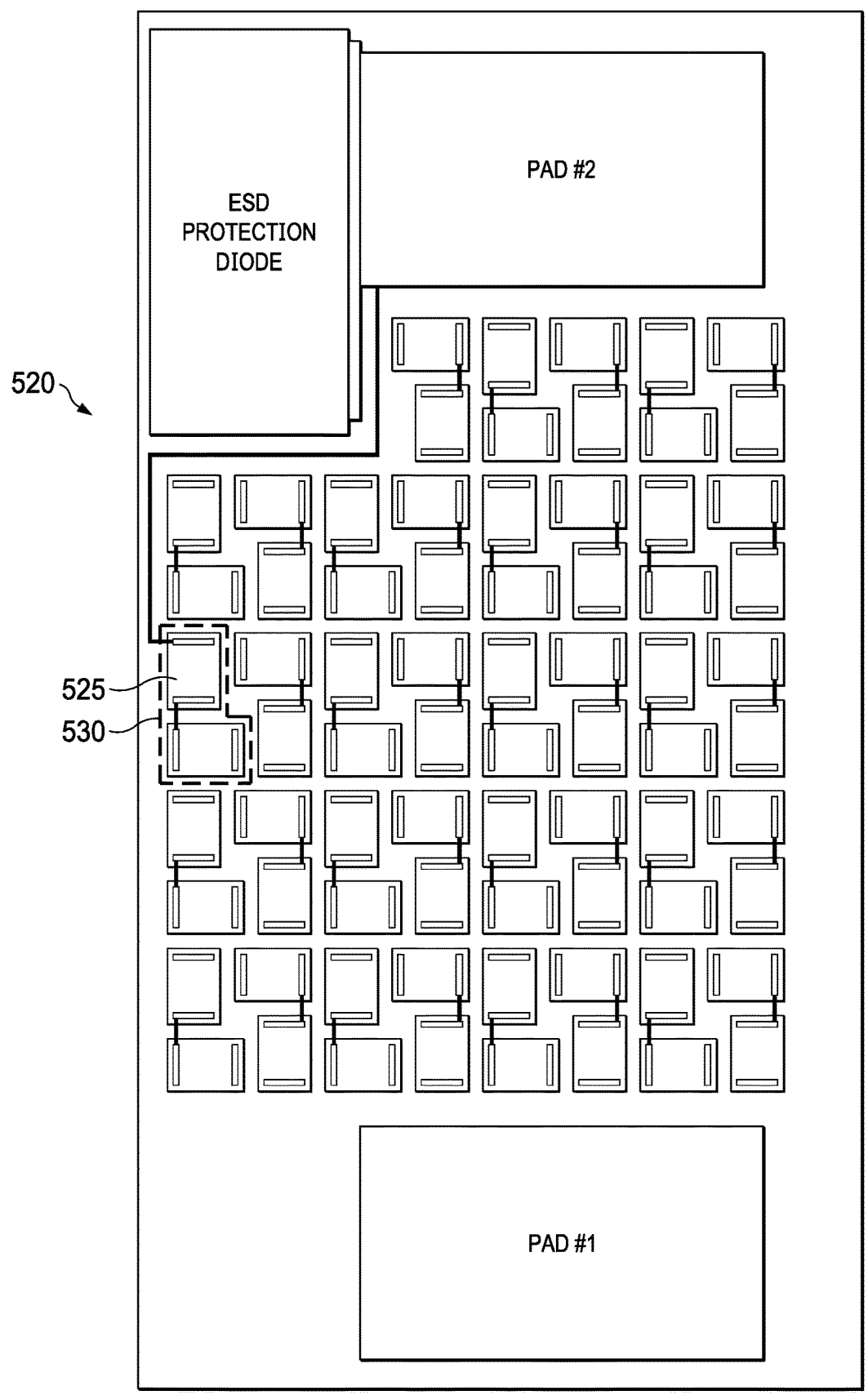

FIG. 5B illustrates another example of an integrated circuit 520 in which a plurality of nominally identical resistor segments 525 are formed on a semiconductor substrate, and configured to conduct in two lattice directions. Interconnections within the IC 520 are generally omitted for clarity, but an interconnection between pad 2 and one resistor segment 525 is shown, as well as interconnections between neighboring pairs of the resistor segments 525. One such pair is shown as resistor pair 530. Each connected pair of resistor segments 525 may be treated as a single resistor, in that the resistor terminals by which the pair is connected are not connected to any other circuit node. Within each resistor pair 530, a horizontal resistor segment is configured to conduct current in the horizontal direction (e.g. [010] or [$\bar{1}$10] for (100) and (111) silicon wafers, respectively), and a vertical resistor segment is configured to conduct current in the vertical direction (e.g. [001] or [$\overline{1}\overline{1}2$] for (100) and (111) silicon wafers, respectively). The vertical and horizontal resistor segments are the same size in the illustrated example, but may be different sizes in some cases, such as when formed on a (100) silicon wafer. According to the previously described principles of the disclosure, any change of resistance of the horizontal resistor segment is expected to be compensated by an opposite and about equal change of resistance of the vertical resistor segment. The integrated circuit 510 may be implemented on a (100) or (111) substrate with suitable attention to resistor geometry.

In the illustrated example the resistor segments 525 may be configured to implement a ladder resistor, though other applications are contemplated. In the ladder resistor, the resistor pairs are connected between the terminal pad 1 and the terminal pad 2 in a resistive network in which resistance steps in the ladder may increase in binary fashion ($R=R_0 \cdot 2^N$, N=0, 1, 2, 3 . . . ) The resistance of the network between pad 1 and pad 2 may be trimmed by blowing fuses connected in series with each resistance step in the ladder. (See U.S. patent application Ser. No. 16/547,615, incorporated herein in its entirety.) Thus a resistor segment at the end of each resistance step may be connected to a fuse (not shown).

Figure 6B:
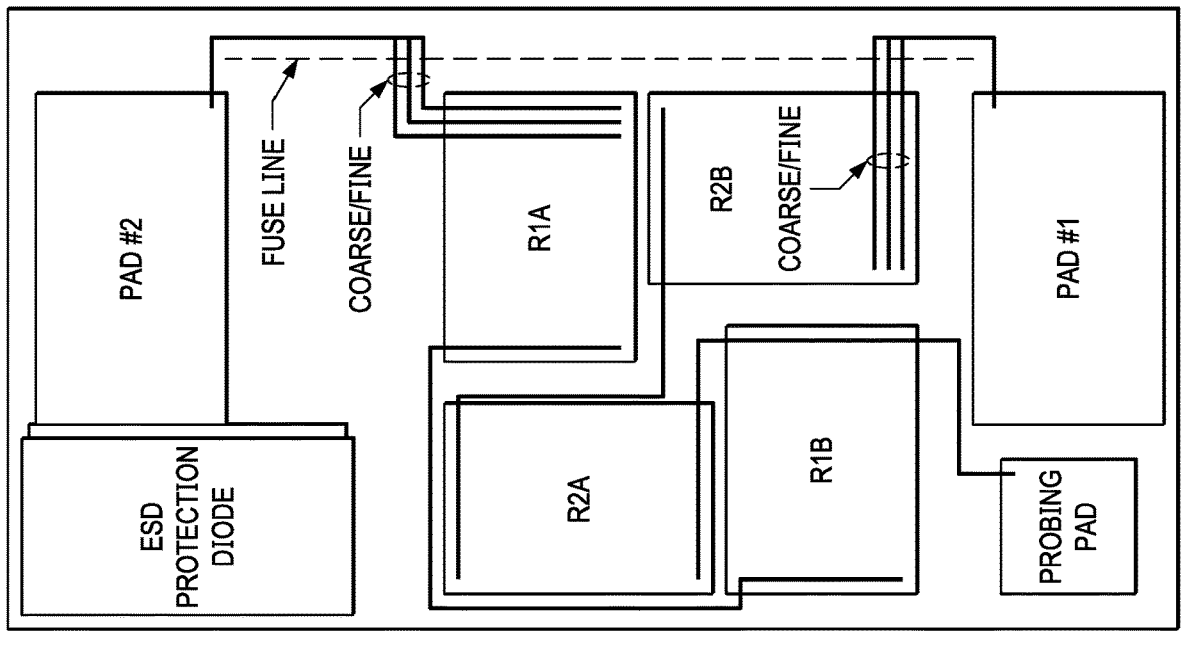
FIGS. 6A-6E illustrate various examples of electronic devices configured according to principles of the disclosure.
Figure 6A:
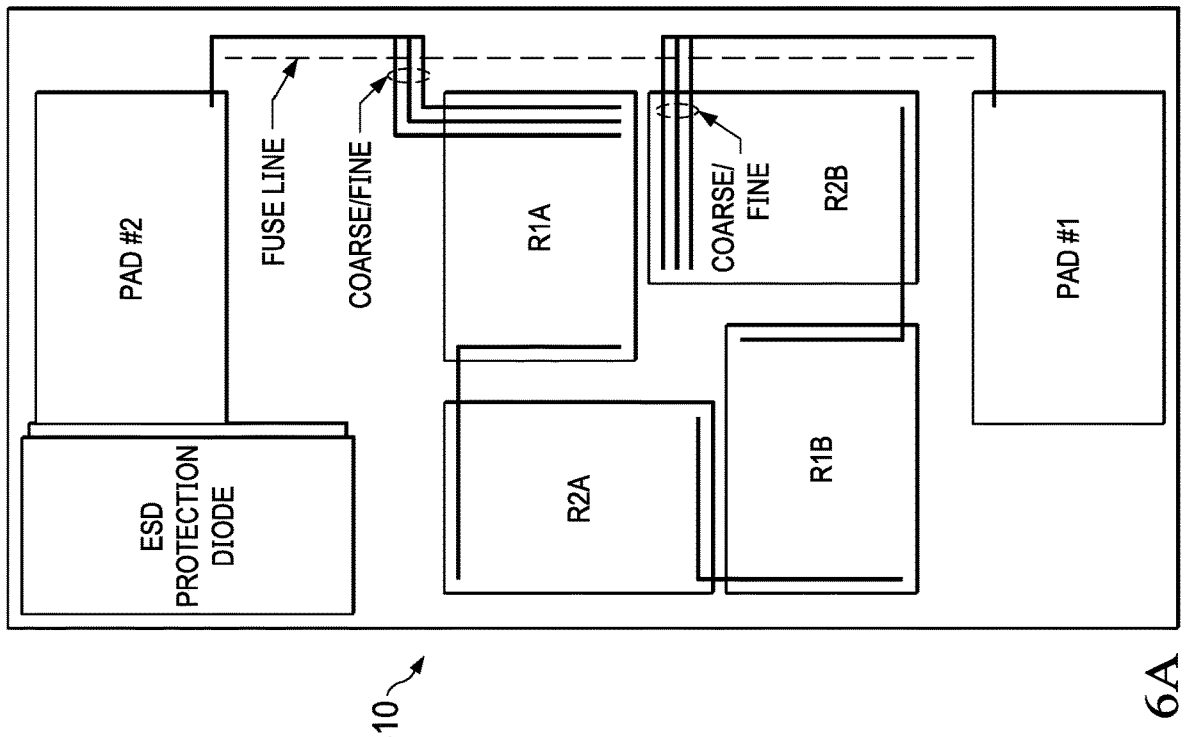

FIGS. 6A-6E present additional examples of resistive network configurations that may benefit from the principles of the disclosure. These examples are described by implementation on a (111) substrate, but may be readily implemented on a (100) substrate with suitable adjustments of resistor geometry. In FIG. 6A nominally identical resistor segments R1A, R1B, R2A and R2B are connected in series in a potentiometer configuration of an IC 610. Coarse and/or fine adjust contact lines connect the resistor segment R2B to pad 1 and coarse and/or fine adjust contact lines connect the resistor segment R1A to pad 2. Interconnect lines connect R2B to R1B, R1B to R2A and R2A to R1A. The interconnections are made such that current flows through R1A and R1B in a horizontal (e.g. [$\overline{1}10$]) direction, and flows through R2A and R2B in a vertical (e.g. [$\overline{1}\overline{1}2$]) direction. The example of FIG. 6A illustrates an optional configuration in which rectangular resistor segments may be placed on the IC 610 such that their long axes are aligned with the direction of current flow. In some other examples the resistor segments may be oriented such that their short axes are aligned with the direction of current flow. In yet some other examples the resistor segments may be square.

FIG. 6B illustrates another example of an IC 620 that includes four nominally identical resistor segments R1A, R1B, R2A and R2B that are connected in series in a potentiometer configuration. As was described for the IC 610, interconnections are made such that current flows through R1A and R1B in the horizontal direction, and flows through R2A and R2B in the vertical direction. The interconnections differ from that of the IC 610 to accommodate a terminal pad, or probing pad. Interconnections connect R2B to R2A, R2A to R1B, and R1B to R1A. The probing pad is connected to the resistive network at a node between R1B and R2A. The resistance of the horizontally oriented resistor segments R1A and R1B may be measured by probing between the probing pad and pad 2. Similarly the resistance of the vertically oriented resistor segments R2A and R2B may be measured by probing between the probing pad and pad 1. In this way a mismatch between the nominally identical values R1A+R1B and R2A+R2B may be detected. Appropriate contact lines connected to R1A and R2B may be selected by fusing to match the resistance contribution in the vertical direction to the resistance contribution in the horizontal direction to match stress effects in the two directions.

Figure 6C:
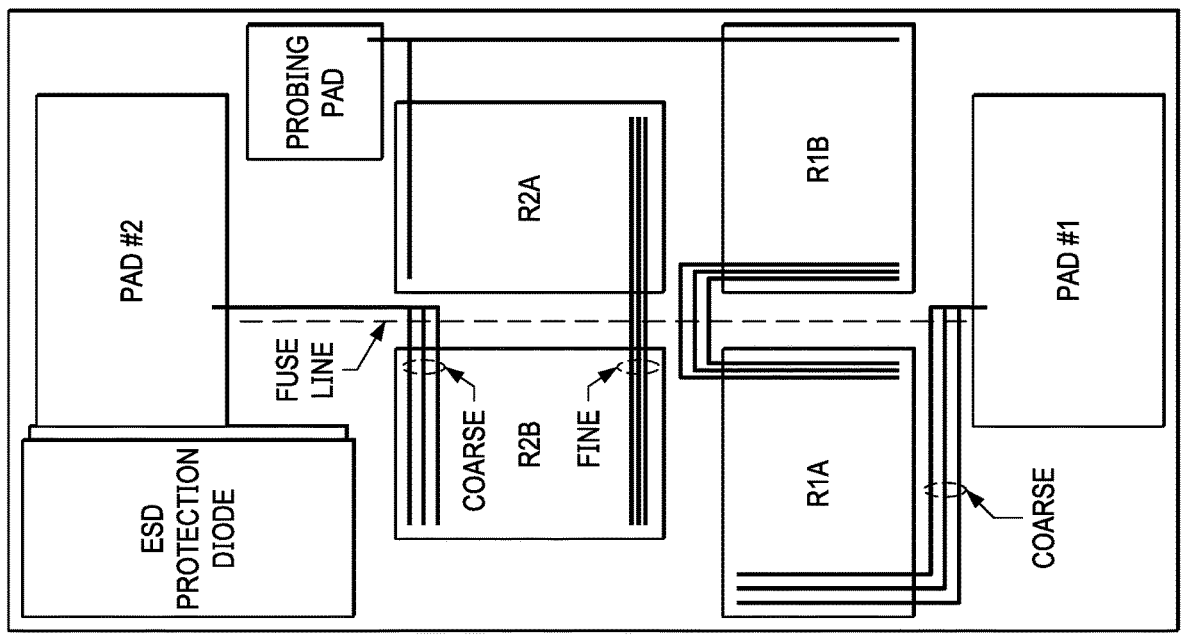

FIG. 6C illustrates another example of a IC 630 that includes four nominally identical resistor segments R1A, R1B, R2A and R2B that are connected in series in a potentiometer configuration. The IC 630 includes a probing pad configured as shown in the IC 620, and the resistor segments are connected in the same order as in the IC 620. In the IC 630, additional adjustment flexibility may be provided by coarse and fine adjust contact lines connected to R1A, and coarse and fine adjust contact lines connected to R2B.

Figure 6D:
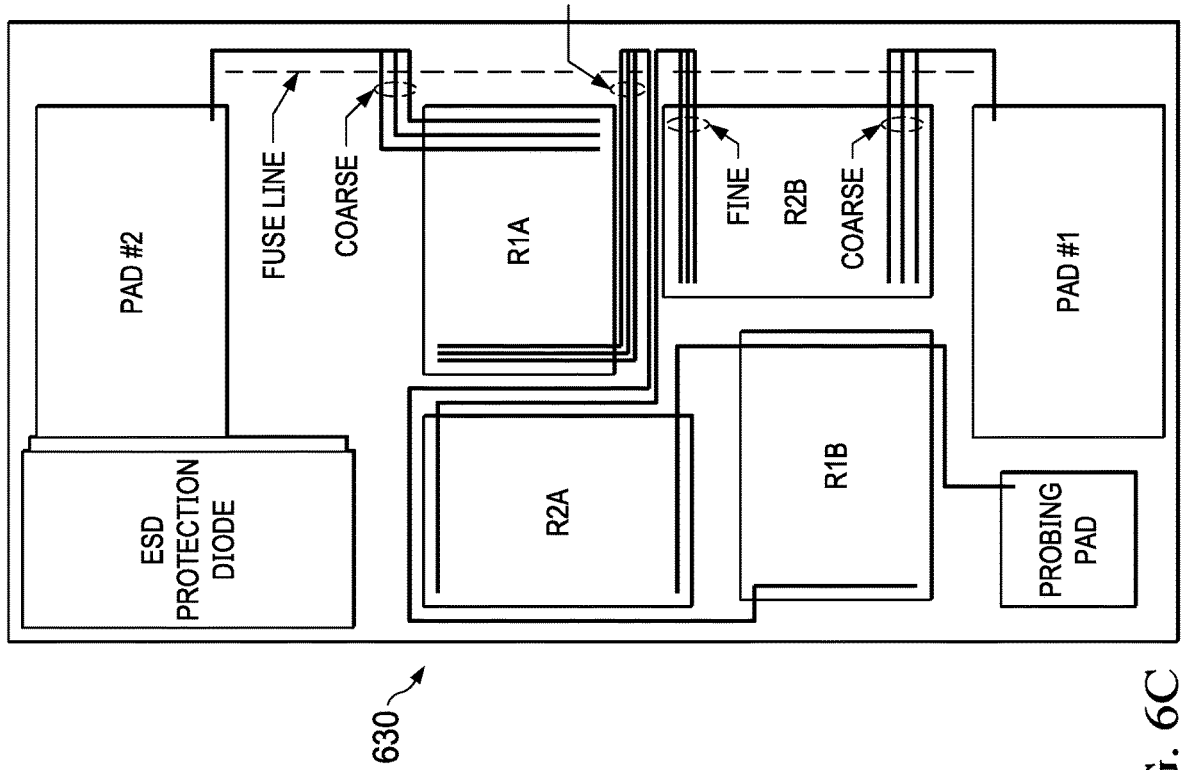

FIG. 6D provides another example of an IC 640 with additional coarse adjust and fine adjust contact lines. In this example the resistor segments are arranged such that interconnections connect R2B to R2A, R2A to R1B, and R1B to R1A. A probing pad is again connected to a node between R2A and R1B. R1A is connected to pad 1 by way of coarse adjustment lines, and is connected to R1B by way of fine adjustment lines. Similarly, R2B is connected to pad 2 by way of coarse adjustment lines, and is connected to R2A by way of fine adjustment lines.

Figure 6E:
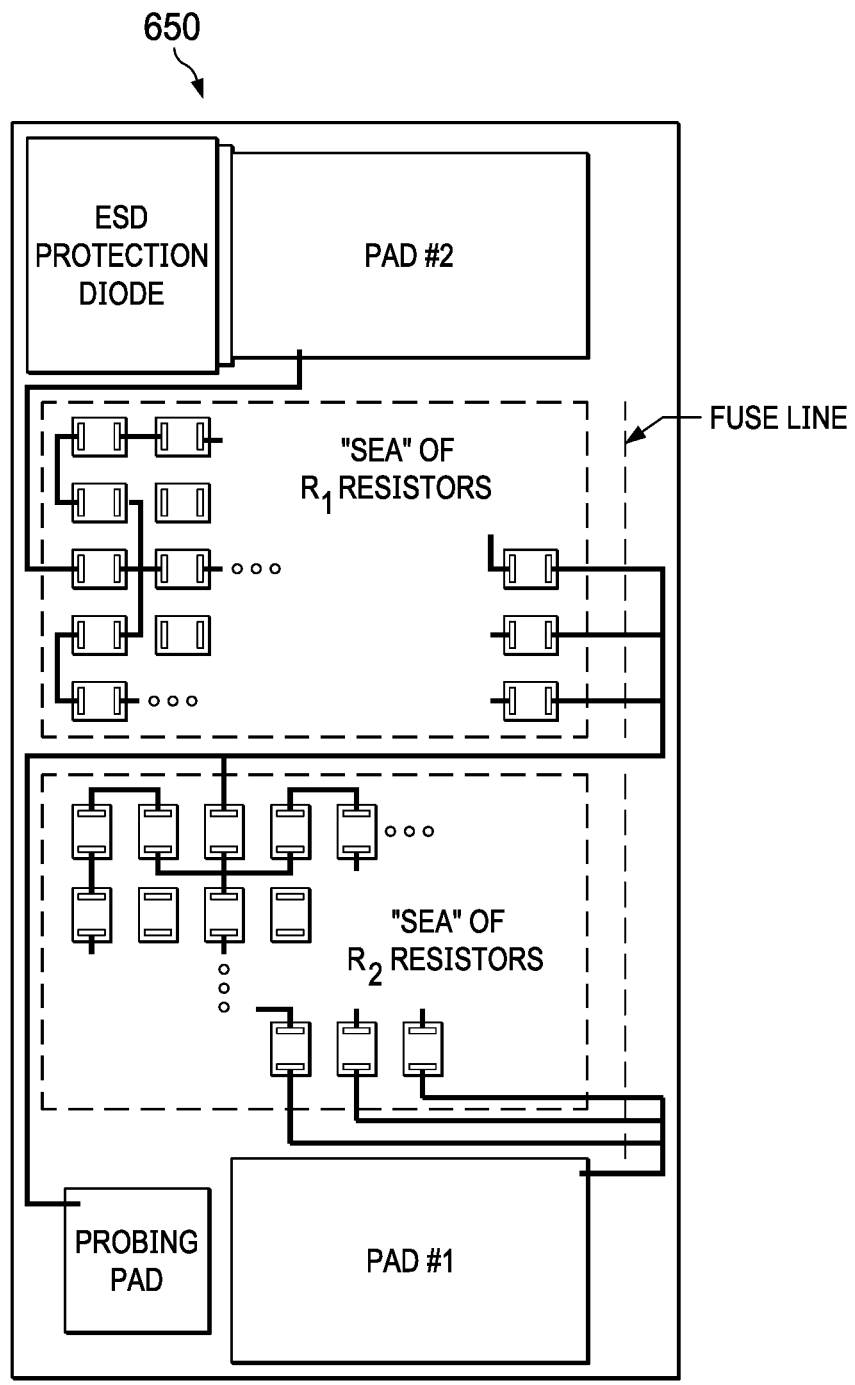

Finally, FIG. 6E provides an example of an IC 650 that is configured as a ladder resistor. A first subset of nominally identical resistor segments is oriented to conduct in the horizontal direction, and a second subset of the nominally identical resistor segments is oriented to conduct in the vertical direction. The segments in the first subset are grouped together and interconnected to form a first resistor network. The segments in the second subset are grouped together and interconnected to form a second resistor network. The two groups are interconnected such that the probe pad can be connected to a circuit node between the first and second groups. The total resistance of the first resistor network and the total resistance of the second resistor network may be independently determined by respectively measuring the resistance between the probe pad and pad 1, and between the probe pad and pad 2. The measured values may be used to detect a mismatch or to confirm an expected resistance before and after blowing corresponding fuses.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. An electronic device, comprising:
a resistive network including first and second resistor segments each having a doped resistive region formed in or over a (111) semiconductor substrate and being connected between first and second terminals, the first resistor segment being configured to conduct a current in a first single direction along a [$\overline{1}\overline{1}2$] or equivalent lattice orientation of the substrate, and the second resistor segment being configured to conduct the current in a second orthogonal single direction along a [$\overline{1}10$] or equivalent lattice orientation of the substrate.

2. The electronic device of claim 1, further comprising first and second contact lines at opposite ends of the first resistor segment, and third and fourth contact lines at opposite ends of the second resistor segment, wherein a resistance between the first and second contact lines is about equal to a resistance between the third and fourth contact lines.

3. The electronic device of claim 1, wherein the first resistor segment has a first length in the first direction, and the second resistor segment has a different second length in the second direction.

4. The electronic device of claim 1, wherein the first resistor segment has a first resistance R1, and the second resistor segment has a different second resistance R2, and R1 is about two times R2.

5. The electronic device of claim 1, wherein the first and second resistor segments are located on a device die having a first axis and a second axis, a length of the device die along the first axis being greater than a length of the device die along the second axis, and a long axis of the first resistor segment is about parallel with the first axis of the device die, and a long axis of the second resistor segment is about parallel with the second axis of the device die.

6. The electronic device of claim 1, wherein the resistive network includes multiple instances of the first resistor segment and/or multiple instances of the second resistor segment.

7. The electronic device of claim 1, further comprising:
a first terminal pad configurable to source current to the resistive network;
a second terminal pad configurable to sink current from the resistive network; and
a third terminal pad connected to the resistive network at a node between the first and second resistor segments.

8. The electronic device of claim 7, wherein the resistive network has a plurality of resistor segments greater than two, and the node is located between a first proper subset of the resistor segments configured to conduct a current in the first direction, and a second proper subset of the resistor segments configured to conduct a current in the second direction.

9. A method of forming an integrated circuit, comprising:
forming a resistive network including first and second resistor segments in a semiconductor substrate, each of the resistor segments having a respective doped resistive region;
interconnecting the first and second resistor segments between first and second terminals such that the first resistor segment is configured to conduct a current in a first direction, and the second resistor segment is configured to conduct the current in a second different direction; and
forming first and second contact lines at opposite ends of the first resistor segment, and third and fourth contact lines at opposite ends of the second resistor segment, wherein a resistance between the first and second contact lines is about equal to a resistance between the third and fourth contact lines.

10. The method of claim 9, wherein the first direction is about aligned with a first crystal lattice orientation of the semiconductor substrate, and the second direction is about aligned with an orthogonal second crystal lattice orientation of the semiconductor substrate.

11. The method of claim 9, wherein the semiconductor substrate is a (111) semiconductor substrate.

12. The method of claim 10, wherein the first crystal lattice orientation is [$\bar{1}\bar{1}2$] or equivalent, and the second crystal lattice orientation is [$\bar{1}10$] or equivalent.

13. The method of claim 9, wherein the semiconductor substrate is a (100) semiconductor substrate.

14. The method of claim 10, wherein the first crystal lattice orientation is [010] or equivalent, and the second crystal lattice orientation is [001] or equivalent.

15. The method of claim 10, wherein the first resistor segment has a first length in the first direction, and the second resistor segment has a different second length in the second direction.

16. The method of claim 10, wherein the first resistor segment has a first resistance R1, and the second resistor segment has a different second resistance R2, and R1 is about two times R2.

17. The method of claim 9, wherein the first and second resistors segments are located on a device die having a first axis and a second axis, a length of the device die along the first axis being greater than a length of the device die along the second axis, and a long axis of the first resistor segment is about parallel with the first axis of the device die, and a long axis of the second resistor segment is about parallel with the second axis of the device die.

18. The method of claim 9, wherein the resistive network includes multiple instances of the first resistor segment and/or multiple instances of the second resistor segment.

19. The method of claim 9, further comprising:
forming a first terminal pad configurable to source current to the resistive network;
forming a second terminal pad configurable to sink current from the resistive network; and
forming a third terminal pad connected to the resistive network at a node between the first and second resistor segments.

20. The method of claim 19, wherein the resistive network has a plurality of resistor segments greater than two, and the node is located between a first proper subset of the resistor segments configured to conduct a current in the first direction, and a second proper subset of the resistor segments configured to conduct a current in the second direction.

21. The electronic device of claim 1, wherein the semiconductor substrate is a silicon substrate.

22. The method of claim 9, wherein the semiconductor substrate is a silicon substrate.

23. An electronic device, comprising:
a (100) semiconductor substrate;
first and second resistor segments each having a doped resistive region formed in or over the semiconductor substrate and being connected between first and second terminals, the first resistor segment being configured to conduct a current in a first single direction along a [010] or equivalent lattice orientation of the substrate, and the second resistor segment being configured to conduct the current in a second orthogonal single direction along a [001] or equivalent lattice orientation of the substrate.

24. An electronic device, comprising:
first and second resistor segments each having a doped resistive region formed in a semiconductor substrate and being connected between first and second terminals, the first resistor segment being configured to conduct a current in a first single direction, and the second resistor segment being configured to conduct the current in a second orthogonal single direction; and
first and second contact lines at opposite ends of the first resistor segment, and third and fourth contact lines at opposite ends of the second resistor segment, wherein a resistance between the first and second contact lines is about equal to a resistance between the third and fourth contact lines.

25. An electronic device, comprising:

first and second resistor segments each having a doped resistive region formed in a semiconductor substrate and being connected between first and second terminals, the first resistor segment being configured to conduct a current in a first single direction, and the second resistor segment being configured to conduct the current in a second orthogonal single direction, wherein the first and second resistor segments are located on a device die having a first axis and a second axis, a length of the device die along the first axis being greater than a length of the device die along the second axis, and a long axis of the first resistor segment is about parallel with the first axis of the device die, and a long axis of the second resistor segment is about parallel with the second axis of the device die.

* * * * *